United States Patent [19]
Winston

[11] Patent Number: 5,320,756
[45] Date of Patent: Jun. 14, 1994

[54] METHOD OF TREATING AQUEOUS ALKALINE EFFLUENTS DERIVED FROM CLEANING ELECTRONIC CIRCUIT ASSEMBLIES

[75] Inventor: Anthony E. Winston, East Brunswick, N.J.

[73] Assignee: Church & Dwight Co., Inc., Princeton, N.J.

[21] Appl. No.: 85,006

[22] Filed: Jun. 29, 1993

[51] Int. Cl.$^5$ .............................. C02F 1/52; C02F 1/28
[52] U.S. Cl. ................................. 210/667; 210/669; 210/702; 210/712; 210/908; 210/805; 134/40; 134/42
[58] Field of Search .................. 134/40, 41, 42; 210/702, 712, 724, 908, 909, 910, 667, 669, 687, 928, 900, 790, 805, 806

[56] References Cited

U.S. PATENT DOCUMENTS

| | | | |
|---|---|---|---|
| 275,277 | 4/1883 | Seiler | 210/702 |
| 2,313,194 | 3/1943 | Fiedler et al. | 210/702 |
| 3,492,159 | 1/1970 | Nowlin | 134/10 |
| 3,627,679 | 12/1971 | Fuller | 210/928 |
| 3,639,206 | 2/1972 | Spruill | 210/928 |
| 3,736,254 | 5/1973 | Croom | 210/928 |
| 3,833,463 | 9/1974 | Croom | 210/928 |
| 3,868,320 | 2/1975 | Hider et al. | 210/928 |
| 3,886,099 | 5/1975 | Hall | 134/42 |
| 3,928,195 | 12/1975 | Hoeltgen et al. | 210/717 |
| 4,028,135 | 6/1977 | Vig et al. | 134/40 |
| 4,216,084 | 8/1980 | Ikari et al. | 210/32 |
| 4,374,028 | 2/1983 | Medina | 210/669 |
| 4,378,296 | 3/1983 | Carlson, Jr. et al. | 210/774 |
| 4,403,949 | 9/1983 | March et al. | 432/147 |
| 4,409,119 | 10/1983 | Burger et al. | 252/156 |
| 4,500,433 | 2/1985 | Ormbsy | 210/669 |
| 4,566,912 | 1/1986 | Borg | 134/13 |
| 4,640,719 | 2/1987 | Hayes et al. | 134/42 |
| 4,676,908 | 6/1987 | Ciepiela et al. | 210/638 |
| 4,849,128 | 7/1989 | Timmons et al. | 210/702 |
| 5,030,293 | 7/1991 | Rich et al. | 134/32 |
| 5,045,117 | 9/1991 | Witherell | 134/21 |
| 5,090,431 | 2/1992 | Theroux et al. | 134/182 |
| 5,108,617 | 4/1992 | Eriksson et al. | 210/679 |
| 5,114,592 | 5/1992 | Schuster et al. | 210/667 |
| 5,232,460 | 8/1993 | Botz | 210/723 |
| 5,264,046 | 11/1993 | Winston et al. | 134/42 |
| 5,269,850 | 12/1983 | Jackson | 134/40 |

*Primary Examiner*—Cynthia L. Nessler
*Attorney, Agent, or Firm*—Charles B. Barris

[57] ABSTRACT

The aqueous effluent from the wash cycle of a process for cleaning electronic circuit assemblies of rosin flux and other organic residues with an aqueous alkaline cleaning solution comprises treating the effluent with an alkaline earth metal compound which reacts with the rosin flux to cause precipitation of an alkaline earth metal rosinate. Alkali saponifiers such as alkali metal carbonates and bicarbonates and carboxylate organic adjuvants in the cleaning solution are also removed from the effluent by reaction with the alkaline earth metal compound to form water insoluble alkaline earth salts which are precipitated from solution.

29 Claims, No Drawings

METHOD OF TREATING AQUEOUS ALKALINE EFFLUENTS DERIVED FROM CLEANING ELECTRONIC CIRCUIT ASSEMBLIES

FIELD OF THE INVENTION

The present invention relates to a method of treating the effluents derived from aqueous wash or rinse solutions which have been used during the cleaning of electronic circuit assemblies. Thus, aqueous wash and/or rinse effluents which contain rosin flux residues, metals, alkaline salts and organic adjuvants to the cleaning solution and which are formed during cleaning electronic circuit assemblies are treated to precipitate the contaminants and saponifiers of the cleaning solution to yield a substantially organic-free and demineralized effluent which can be directly sewered.

BACKGROUND OF THE INVENTION

The cleanliness of electronic circuit assemblies (ECA), such as printed circuit boards (PCB) or printed wiring boards (PWB), is generally regarded as being critical to their functional reliability. Ionic and nonionic contamination on circuit assemblies is believed to contribute to premature failures of the circuit assemblies by allowing short circuits to develop.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In the fabrication of electronic circuit assemblies, e.g., printed circuit boards, soldering fluxes are first applied to the substrate board material to ensure firm, uniform bonding of the solder. These soldering fluxes fall into two broad categories: rosin and non-rosin, or water soluble, fluxes. The rosin fluxes, which are generally only moderately corrosive and have a much longer history of use, are still widely used throughout the electronics industry. The water soluble fluxes, which are a more recent development, are being used increasingly in consumer products applications. Because water soluble fluxes contain strong acids and/or amine hydrohalides, such fluxes are very corrosive. Unfortunately, residues of any flux can cause circuit failure if residual traces of the material are not carefully removed following soldering and thus remain on an electronic circuit assembly.

While water soluble fluxes can be easily removed with warm, soapy water, the removal of rosin flux from printed circuit boards is more difficult and has therefore traditionally been carried out with the use of chlorinated hydrocarbon solvents such as 1,1,1,-trichloroethane, trichloroethylene, trichloromonofluoromethane, methylene chloride, trichlorotrifluoroethane (CFC113), tetrachlorodifluoroethane (CFC112) or mixtures or azeotropes of these and/or other solvents. These solvents are undesirable, however, because they are toxic and when released into the environment deplete the ozone layer and/or contribute to the greenhouse global warming effect. Thus, use of such solvents is subject to close scrutiny by the Occupational Safety and Health Administration (OSHA) and the Environmental Protection Agency (EPA) and stringent containment equipment must be used. Moreover, if released into the environment these solvents are not readily biodegradable and are thus hazardous for long periods of time.

Alkaline cleaning compounds known as the alkanolamines, usually in the form of monoethanolamine, have been used for rosin flux removal as an alternative to the toxic chlorinated hydrocarbon solvents. These high pH compounds (e.g., about 12 pH), chemically react with rosin flux to form a rosin soap through the process of saponification. Unfortunately, these compounds, as well as the water soluble soldering fluxes, have a tendency to cause corrosion on the surfaces and interfaces of printed wiring boards if such compounds and fluxes are not completely and rapidly removed during the fabrication process.

Other approaches have been used including a highly caustic solution having a pH of 13 in a batch cleaning process and use of terpene compounds in combination with terpene emulsifying surfactants.

The complete removal of adhesive and other residues also poses a problem. During the manufacture of electronic circuit assemblies the components are mounted on the upper surface of the board with leads protruding downwardly through holes in the board and are secured to the bottom surface of the board by means of an adhesive. Further, it is sometimes necessary to temporarily protect certain portions of the board from processing steps such as the process of creating corrosion resistant gold connecting tabs at the board edges. This transient protection of portions of the circuit board can be achieved by the application of special adhesive tape to susceptible areas. Once such protection is no longer needed, the adhesive tape must be removed. In both instances, a residue of adhesive generally remains which, if not thoroughly removed, can cause premature board failure. Removal of this adhesive residue has traditionally been carried out by the use of chlorinated solvents which, as already described, are toxic and environmentally undesirable.

Thus, the residual contaminants which are likely to be found on electronic circuit assemblies and which must be removed include, but are not limited to, for example, rosin flux, photoresist, solder masks, adhesives, machine oils, greases, silicones, lanolin, mold release, polyglycols and plasticizers.

Instead of the toxic chlorinated hydrocarbon solvents and the highly corrosive and highly basic amine cleaning solutions and the other organic solvent cleaning systems which pose problems to the environment, an alternative aqueous alkaline cleaning solution has been developed by the assignee to remove the rosin fluxes, adhesive residues and the like from electronic circuit assemblies. These compositions are set forth in copending commonly assigned U.S. Patent Application Nos. 896,381; 896,660; 896,409; 896,365; 896,379, all filed Jun. 10, 1992 and 731,512, filed Jul. 17, 1991. These applications disclose aqueous alkaline cleaning solutions containing alkaline salts such as alkali metal carbonates and mixtures thereof with alkali metal bicarbonates and adjuvants such as alkali metal silicates to inhibit corrosion and brighten metal components, surfactants to aid in the cleaning efficacy of the cleaning solution, hydrotropes to maintain the surfactant in solution and stabilizers to maintain the alkali metal silicate in solution. These cleaning solutions have a pH ranging from about 10 to 13 and, in particular, are effective at solution pH's of less than 12 and are preferably utilized with an adequate reserve of titratable alkalinity to provide effective cleaning of the rosin fluxes and other adhesive residues and the like from the circuit assemblies.

For the removal of rosin soldering flux deposits, adhesives and the other residues during printed circuit/wiring board fabrication, the aqueous alkaline compositions are applied to the boards by immersion in dip tanks or by hand or mechanical brushing. Alternatively, the cleaning solutions can be applied by any of the commercially available printed wiring board cleaning equipment. Dishwasher size units may be employed, or much larger cleaning systems such as the "Poly-Clean +" and the various "Hydro-Station" models produced by Hollis Automation, Inc. of Nashua, N.H.

The temperature at which the flux removing compositions are applied typically range from room, or ambient, temperature (about 70° F.) to about 180° F., preferably, about 140° to 170° F. The flux removing compositions or concentrates are diluted with water to from as low as about 0.1 percent by weight (or volume) concentration and up to about 15 percent by weight.

Once the solder flux has been loosened and removed during a period of contact which typically ranges from about 1 to about 5 minutes, but may be longer up to about 10 minutes, the boards are taken from the flux removing solution. Another advantage of the aqueous alkaline cleaning solutions described previously and in the aforementioned copending assigned U.S. Applications is that these flux removing solutions need not be flushed with solvents as with the processes of the prior art. The boards are simply flushed with water for a period of up to about 2 minutes. Deionized water is preferred. The optimal rinsing time varies according to the kinds of surfactants and the concentrations of the flux removing solutions used and can easily be determined by routine experimentation.

The effluents from both the wash and rinse cycles from the cleaning process contain rosin flux residues, lead, tin and other materials removed from the electronic circuit assemblies as well as alkali metal carbonate, bicarbonate and silicate salts in addition to surfactants and other polymeric stabilizers used in the cleaning compositions. These effluents without treatment cannot be sewered and, further, cannot be recycled for use in the wash and rinse cycles. For example, in the disposal of industrial cleaning solutions, municipalities often mandate the levels of impurities which are allowable in sewage effluents. Thus, the regulations frequently mandate maximum permitted pH, maximum allowable heavy metals and maximum allowable organics measured as BOD or COD.

Accordingly, a treatment process is needed to remove the contaminants from the wash and rinse water effluents and preferably, provide sufficient removal of these materials such that the water can be directly sewered.

In copending, commonly assigned U.S. application Ser. No. 08/085,005, filed Jun 29, 1993, a multistage process for treating aqueous alkaline effluents containing rosin fluxes, carbonates, heavy metals and the like is disclosed. The treatment process includes carbon absorption to remove organic residues, ion exchange to remove metals and aeration to remove dissolved $CO_2$ formed from the carbonates during ion exchange. While the multistage process is an effective method for removing these contaminants from aqueous effluents, when the effluents are more highly concentrated in organic matter, carbonates, metal impurities and the like, passage of such effluents through carbon or ion exchange resin beds may soon overload such beds reducing the efficiency of contaminant removal and requiring substantial time and capital expense in regenerating the beds.

SUMMARY OF THE INVENTION

In accordance with the present invention, the aqueous effluent from the wash cycle of a process for cleaning electronic circuit assemblies using an aqueous alkaline cleaning solution is treated to precipitate rosin flux, metals and other residual contaminants washed from the electronic circuit assemblies and, as well, precipitate the carbonates and bicarbonates and adjuvants present in the aqueous alkaline cleaning solution so as to yield an aqueous effluent which has a lower pH, lower metal content and lower BOD or COD levels and, therefore, can be directly sewered.

The aqueous effluents which are contaminated with the residuals washed from the electronic circuit assemblies and from the components of the cleaning solution can be treated by the addition of an alkaline earth metal compound in the form of a solid, aqueous solution or suspension thereof. The alkaline earth metal cation reacts with the soluble carbonates, bicarbonates and silicates from the cleaning solution to precipitate the respective alkaline earth metal carbonates, bicarbonates and silicates which are insoluble in water. Additionally, the alkaline earth metal compound reacts with the anionic materials in the effluent including the rosin flux which is primarily abietic acid so as to form an alkaline earth metal salt of same which is precipitated as the alkaline earth metal rosinate. Nonionic organic materials such as surfactants and the heavy metals typically coordinated with the rosin flux are entrapped within the precipitated alkaline earth metal salts and are also removed from the aqueous effluent. If needed, the aqueous effluent subsequent to the addition of the alkaline earth metal compounds may be subjected to carbon absorption to remove any organics which are not precipitated or carried from the solution by the precipitating insoluble alkaline earth metal salts.

DETAILED DESCRIPTION OF THE INVENTION

The water treatment process of the present invention is particularly useful for treating effluents from the wash cycle of an electronic assembly cleaning process in which an aqueous alkaline cleaning solution is used to remove the flux and other contaminants from the assemblies and in which the cleaning solution preferably contains alkali metal carbonate and/or bicarbonate salts as the primary deterslye agents. Especially preferred carbonates include potassium carbonate, potassium carbonate dihydrate, and potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate and sodium bicarbonate and mixtures thereof.

The cleaning solutions may also contain other suitable alkaline salts such as the alkali metal ortho or complex phosphates. The complex phosphates are especially effective because of their ability to chelate water hardness and heavy metal ions. The complex phosphates include, for example, sodium or potassium pyrophosphate, tripolyphosphate and hexametaphosphates. Additional suitable alkaline salts useful in the cleaning compositions include the alkali metal borates, acetates, citrates, tartrates, gluconates, succinates, silicates, phosphonates, nitrilotriacetates, edates, etc.

The alkaline salts are utilized in combination and in concentrations such that the resultant cleaning solutions have a pH of from about 10, or somewhat less, to 13, preferably from about 10 to less than 12 and, more preferably from 10.5 to 10.9. The desired pH of the cleaning solution may depend on the type of flux being removed. Thus, the lower pH range is desirable and effective for removing the more easily removed fluxes. However, a pH of above 11.5 is preferred when removing the more difficult to remove solder paste fluxes. It is also most desirable that the alkaline salts utilized in combination at the dilution of the wash bath and at the desired pH also have an adequate reserve of titratable alkalinity, at least equivalent to from about 0.2 to 4.5 percent, preferably, 0.6 to 4.5 percent caustic potash (potassium hydroxide), when titrated to the colorless phenolphthalein end point, which is at about pH 8.4 to maintain enhanced performance. The useful cleaning solutions, therefore, have relatively high concentrations of alkaline salts and high pH and cannot be sewered without treatment especially when containing the contaminants from the ECA.

The preferred flux removing compositions also typically contain one or more corrosion inhibitors to prevent corrosion or pitting of the connecting tabs or solder joints, metals or other materials present on the circuit boards being cleaned. The corrosion inhibitor is an alkali metal silicate salt with the sodium and potassium silicate salts being most preferred. While the ratio of the two oxides can vary, most useful alkali metal silicates will have an $M_2O$ to $SiO_2$ mole ratio of between 1:0.5 to 1:4.5 wherein M represents the alkali metal. The silicates also provide additional alkalinity to the wash water to help cleaning. The addition of silicate actually promotes the brightness and shininess of the solder joints. For sufficient corrosion protection, it is useful to add 0.1 to 20 wt.% of the silicate corrosion inhibitor based on the amount of cleaning composition (without water).

At pH below 13 and, in particular, below 12, it has been found that the silicate precipitates from aqueous solutions. The silicates are stabilized and kept in aqueous solution by the addition of an anionic polymer to the composition. Particularly preferred are anionic polymers containing carboxylate groups.

In general, anionic homopolymers or copolymers with molecular weights between about 1,000 to about 5,000,000 or mixtures thereof are usefully employed as silicate stabilizers. The following anionic polymers are non-inclusive examples of those suitable for stabilizing silicate solutions: carboxymethylcellulose, polyacrylic acid, polymethacrylic acid, polymaleic acid, polyglycolic acid, heteropolymers of acrylic and methacrylic acid, xanthan gum, carrageenan gum and alginate gum. In the alkaline cleaning solutions, the anionic polymers are essentially present in the form of the sodium or potassium salts thereof. The high molecular weight, e.g., above 150,000, polyacrylic acids are especially preferred.

The cleaning compositions also typically include antifoam agents and surfactants to enhance deterslye efficacy and hydrotropes to aid in maintaining the solubilization of the organic adjuvants. A preferred hydrotrope includes the alkali metal salts of intermediate chain length monocarboxylic fatty acids, i.e., $C_1$–$C_{13}$.

Washed off of the electronic circuit assemblies and carried into the wash and rinse water during the cleaning process are primarily the rosin fluxes, solder, as well as any residues of adhesive which remain on the assemblies. Also, removed are photoresist, solder mask, machine oils, greases, silicones, lanolin, mold release agents, polyglycols and plasticizers, etc. The aqueous wash and rinse effluents also contain the alkaline salts and organic agents as described above. To sewer the aqueous phase of the wash effluent from the electronic circuit assembly cleaning process, it is necessary to remove not only the contaminants which are cleaned from the electronic circuit assemblies but, the components of the cleaning composition as well. Moreover, governmental mandates require that aqueous effluents which are sewered must have a minimum level of cleanliness as exemplified by standards for pH, metal content and BOD and/or COD levels. A typical wash water effluent from an ECA cleaning process is characterized in Table 1.

TABLE 1

| Wash Water Effluent from ECA Cleaning Process | | |
|---|---|---|
|  | Typical | Range |
| pH | 10.5 | 10.0–12.0 |
| Specific gravity | 1.05 | 0.95–1.1 |
| Non-volatile solids | 2.2% | 0.2–10.0% |
| Hardness | 0 ppm | 0.0–10 ppm |
| Lead | 1 ppm | 0.1–10 ppm |
| Other heavy metals | 10 ppm | 0.2–25 ppm |
| Alkalinity as $CaCO_3$ | 22,000 ppm | 2,000–100,000 ppm |
| COD | 10,000 ppm | 2,000–20,000 ppm |
| Potassium | 6,000 ppm | 0.0–50,000 ppm |
| Sodium | 4,000 ppm | 0.0–50,000 ppm |
| Chloride | 100 ppm | 0.0–1,000 ppm |
| Silica | 400 ppm | 0.0–5,000 ppm |

The treatment of the wash effluent from the electronic circuit assembly cleaning process for the sewering thereof is achieved by precipitating the contaminants from the water phase. The precipitation is achieved by chemical treatment with an alkaline earth metal salt or compound which reacts with the contaminants to form insoluble salts.

In the process for treating the aqueous wash effluent from the process for cleaning electronic circuit assemblies, the wash effluent is treated by the addition of alkaline earth metal compounds, in particular, calcium and magnesium compounds. Calcium compounds are preferred. Useful compounds include calcium salts such as calcium nitrate and calcium chloride which is preferred. Similarly, magnesium salts such as magnesium nitrate, magnesium sulfate and magnesium chloride can be used. The compounds may be used individually or as a mixture. Other divalent metals can be used in the form of metal salts as precipitating agents including salts of barium and zinc.

The calcium and magnesium salts such as calcium and magnesium chloride are soluble and can be added directly to the aqueous effluent. Nonsoluble compounds can be used in the form of a bed through which the effluent is passed. The alkaline earth metal salts or compounds can be added to the contaminated cleaning effluents at the operating temperature of the cleaning solution or at room temperature, whichever is more convenient. Typically, 0.1–5 wt.% of the salt is added relative to the weight of the effluent being treated. Preferred amounts range from about 1–3 wt.% of the alkaline earth metal compound or salt. The effluent regardless of how treated is filtered to separate the precipitated solids.

The anion of the alkaline earth metal salt treating agent is important inasmuch as such anion is likely to be retained in the effluent. Thus, the reactive alkaline earth metal compound or salt should be chosen so as to not add a compound to the cleaning effluent which itself must be removed or is adverse to the ability of the effluent to meet environmental mandates and be directly sewered once the rosin fluxes, metals, alkali saponifiers and other organics are precipitated. Accordingly, the alkaline earth metal chlorides are preferred.

For example, specifically referring to the addition of an alkaline earth metal chloride and, in particular, calcium chloride, this soluble salt can be added directly to the cleaning effluents and will react with the rosin fluxes to yield the calcium rosinate which essentially is the calcium salt of abletic acid. Heavy metals such as tin and lead are believed to be coordinated or otherwise tied to the rosin flux and will precipitate with the calcium rosinate. Additionally, the calcium chloride will react with the carbonates, bicarbonates and silicates present in the aqueous effluent from the cleaning solution to yield the insoluble calcium carbonate, and bicarbonate and calcium silicate salts. The reaction of calcium chloride with the sodium carbonate used in the cleaning solution is as follows:

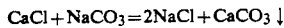

The calcium cation replaces the alkali metal cation of the cleaning salts to form insoluble salts which are precipitated while the alkali metal cation forms a simple environmentally safe salt with the chloride anion. The pH of the solution also favorably drops. Additionally, the organic adjuvants to the cleaning solution, in particular, the anionic polymer to maintain the solubility of the silicate corrosion inhibitor and the fatty acid hydrotrope to the maintain the surfactant and antifoam agent in solution will also be at least partially precipitated as the calcium salts thereof. During the precipitation process, the other organic materials such as surfactant and as well the metals contained in the effluent are entrapped within the precipitating compounds and are also essentially removed from the solution. Subsequent to treatment, the wash effluent has a more environmentally preferred pH and substantially reduced contaminant level. Table 2 illustrates a typical wash effluent from an ECA cleaning process which has been treated with calcium chloride by the process of this invention.

TABLE 2

Wash Water Effluent from ECA Cleaning Process Subsequent to Treatment with Calcium Chloride

| | Typical Example | Example Range |
|---|---|---|
| pH | 8.5 | 7.5–9.0 |
| Specific gravity | 1.05 | 0.95–1.1 |
| Non-volatile solids | 2.0% | 0.2–10.0% |
| Hardness | 10 ppm | 0.0–100 ppm |
| Lead | 0.05 ppm | <0.2 ppm |
| Other heavy metals | 0.05 ppm | <0.2 ppm |
| Alkalinity as $CaCO_3$ | 2,000 ppm | 200–5,000 ppm |
| COD | 5,000 ppm | 500–15,000 ppm |
| Potassium | 6,000 ppm | 0.0–50,000 ppm |
| Sodium | 4,000 ppm | 0.0–50,000 ppm |
| Chloride | 13,000 ppm | 1,000–70,000 ppm |
| Silica | 50 ppm | 0.0–500 ppm |

The inventive method can be readily integrated into the conventional cleaning equipment for the electronic circuit assemblies such as previously described by continuously withdrawing a certain partial flow from the wash solution which is to be treated, and is contained, for example, in a cleaning bath. The specific alkaline earth metal compound is added to this partial flow either directly in solid form or in the form of an aqueous solution or suspension or the effluent is passed through a bed of the reactive compound. After an appropriate reaction time, the resulting insolubles precipitate, such as in the form of a solid calcium rosinate and calcium carbonate which are continuously removed by conveying the partial flow through a suitable filtering system. The partial flow freed from the insoluble precipitates is sewered. Instead of withdrawing a partial flow, the entire wash solution can also be drawn off from the bath into a container after termination of operation, and can then be treated with the specific alkaline earth metal compound. After a certain reaction time, the wash solution can be freed from the precipitating solid salts, and can be sewered.

The treated aqueous effluents now freed from the precipitated rosin fluxes, metals and alkaline saponifiers in the cleaning solution can be directly sewered or may be further treated to insure complete removal of contaminants. Thus, the aqueous effluents now freed from the highly concentrated contaminants can be directed to a carbon bed to remove traces of organic material without overloading the absorption bed.

The process of this invention can be combined with the multistage process of the aforementioned copending application Ser. No. 08/085,005 by dividing the treatment process so as to treat the wash effluents by the chemical treatment as described herein and the rinse effluents by the process described in the copending application.

Alternative to precipitating the contaminants in the cleaning effluents by the addition of alkaline earth metal compounds, it is also possible to subject the contaminated aqueous effluent to evaporation. Inasmuch as the aqueous alkaline cleaning effluents which are used do not contain volatile organic materials, the evaporation of the aqueous phase of the effluent can be performed in an environmentally safe manner. The nonvolatile rosin fluxes, metals and heavier organic materials do not vaporize and are removed from the effluent. The vaporized aqueous phase can be condensed and sewered or recycled.

While the preferred embodiments have been described as a treatment process for the wash effluents from the ECA cleaning process, it may also be useful to treat the rinse water effluents. The rinse water effluents, however, are not so heavily concentrated with contaminants that precipitation and sewering is preferred. Thus, the rinse water effluents can be passed through a multistage process without quickly overloading absorption or ion exchange beds.

EXAMPLE

A wash solution, which has been used for 1 week to clean electronic circuit boards and which contains approximately 1.5% sodium and potassium carbonates, bicarbonates and other inorganic salts, surfactants and polycarboxylated polymer, as well as dissolved and emulsified flux and soil residues removed from the circuit boards and which has a pH of about 10.6 is treated with 2.0% powdered calcium chloride with mixing.

After 10 minutes the solid precipitate is allowed to settle and the supernatant solution is decanted off and filtered. The sludge is filter pressed to remove the remaining liquid and dried in an oven at 105° F. The dried sludge contains various compounds including calcium carbonate, the calcium salts of flux residues, the calcium salt of the polycarboxylated polymer as well as entrapped surfactants and heavy metals. It can safely be disposed of as solid waste. The filtered solution has a safe disposal pH of about 8.3, has an organic content of 150 ppm as BOD and a lead, tin and other heavy metal content of less than 0.1 ppm.

What is claimed is:

1. A process for treating an aqueous cleaning effluent containing rosin flux residues and metals which are coordinated or otherwise tied to said rosin flux residues which comprises: treating said effluent with an alkaline earth metal compound in amounts sufficient to cause reaction of the alkaline earth metal compound with said rosin flux residues and cause precipitation of an alkaline earth rosinate and coordinated metals from said effluent.

2. The process of claim 1 wherein said alkaline earth metal compound comprises a calcium or magnesium compound.

3. The process of claim 2 wherein said alkaline earth metal compound is a calcium or magnesium water soluble salt.

4. The process of claim 3 wherein said water soluble salt comprises calcium or magnesium chloride.

5. The process of claim 4 wherein said water soluble salt comprises calcium chloride.

6. The process of claim 1 wherein said alkaline earth metal compound is added as a solid to said effluent to effect said treatment.

7. The process of claim 1 wherein said effluent is passed through a bed of alkaline earth metal compound solids to effect said treatment.

8. The process of claim 6 wherein said alkaline earth metal compound is added in amounts of from about 0.1 to 5 wt. % relative to said effluent.

9. The process of claim 8 wherein said alkaline earth metal compound is calcium chloride.

10. The process of claim 1 wherein said metals comprise tin, lead or a mixture thereof.

11. A process for treating an aqueous cleaning effluent containing rosin flux residues and obtained from the wash cycle of a process for cleaning electronic circuit assemblies with an aqueous alkaline cleaning solution, which comprises: treating said effluent with an alkaline earth metal compound in amounts sufficient to cause reaction of the alkaline earth metal compound with said rosin flux residues and cause precipitation of an alkaline earth rosinate from said effluent.

12. The process of claim 11 wherein said aqueous cleaning effluent further contains alkali metal carbonates, alkali metal bicarbonates or both originally present as detersive agents in said alkaline cleaning solution and wherein said alkaline earth metal compound reacts with said carbonates, bicarbonates, or both to form water insoluble alkaline earth metal carbonates, bicarbonates or both.

13. The process of claim 11 wherein said aqueous cleaning effluent further contains alkali metal silicates originally present in said alkaline cleaning solution and wherein said alkaline earth metal compound reacts with said silicates to form an alkaline earth metal silicate which is insoluble in water.

14. The process of claim 11 wherein said aqueous cleaning effluent further contains carboxylated organic adjuvants originally present in said cleaning solution and said alkaline earth metal compound reacts with said carboxylates to form water insoluble alkaline earth metal salts thereof.

15. The process of claim 11 wherein the treated aqueous wash cycle effluent is sewered.

16. The process of claim 11 wherein said effluent is passed through a bed of alkaline earth metal compound solids to effect said treatment.

17. The process of claim 11 wherein said alkaline earth metal compound is added as a solid to said effluent to effect said treatment.

18. The process of claim 17 wherein said alkaline earth metal compound is added in amounts of from about 0.1 to 5 wt. % relative to said effluent.

19. The process of claim 18 wherein said alkaline earth metal compound is added in amounts of from about 1 to 3 wt. % relative to said effluent.

20. The process of claim 18 wherein said alkaline earth metal compound is calcium chloride.

21. The process of claim 11 wherein said alkaline earth metal compound comprises a calcium or magnesium compound.

22. The process of claim 21 wherein said alkaline earth metal compound is a calcium or magnesium water soluble salt.

23. The process of claim 22 wherein said water soluble salt comprises calcium or magnesium chloride.

24. The process of claim 23 wherein said water soluble salt comprises calcium chloride.

25. The process of claim 11 wherein the process for cleaning said electronic circuit assemblies further includes a rinse cycle in which said cleaned assemblies are rinsed with water to form a rinse effluent, said effluent from said wash cycle being treated with said alkaline earth metal compound sand said effluent from said rinse cycle bypassing said alkaline earth metal treatment.

26. The process of claim 25 wherein said effluent from said rinse cycle contains at least a portion of said rosin flux residues in addition to metal ions washed from said electronic circuit assemblies, alkali metal saponifiers, and organic adjuvants from said cleaning solution, and wherein said effluent from said rinse cycle is passed through an activated carbon led to effect removal of said rosin flux residues and organic adjuvants to form a substantially organic-free effluent and wherein said substantially organic-free effluent is passed through an ion exchange resin bed to remove said metal ions as well as alkali metal cations from said alkali metal saponifiers.

27. The process of claim 26 wherein the treated wash cycle effluent is sewered and the treated rinse cycle effluent is recycled as makeup water to said process for cleaning electronic circuit assemblies.

28. The process of claim 26 wherein subsequent to said treatment with said alkaline earth metal compound said precipitated alkaline earth rosinate is separated from the effluent from said wash cycle, and thereafter said effluent from said wash cycle is combined with said rinse cycle effluent and treated in said carbon bed.

29. The process of claim 26, wherein said alkali metal saponifiers comprise alkali metal carbonates, alkali metal bicarbonates or mixtures thereof.

* * * * *